(12) United States Patent
Tsui et al.

(10) Patent No.: US 6,242,790 B1
(45) Date of Patent: Jun. 5, 2001

(54) USING POLYSILICON FUSE FOR IC PROGRAMMING

(75) Inventors: Ting Y. Tsui, Palo Alto, CA (US); Reading Maley, San Francisco, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/385,550

(22) Filed: Aug. 30, 1999

(51) Int. Cl.$^7$ .................................................. H01L 29/00

(52) U.S. Cl. .......................................... 257/529; 257/538

(58) Field of Search ................................... 257/209, 529, 257/538

(56) References Cited

U.S. PATENT DOCUMENTS

| | | | |
|---|---|---|---|
| 5,493,148 | * | 2/1996 | Ohata et al. .......................... 257/529 |
| 5,976,943 | * | 11/1999 | Manley et al. ....................... 438/382 |

OTHER PUBLICATIONS

M. Alavi et al., "A PROM Element Based on Salicide Agglomeration of Poly Fuses in a CMOS Logic Process" IEDM 97 (Dec. 1997) pp. 855–858.*

* cited by examiner

Primary Examiner—Sara Crane
(74) Attorney, Agent, or Firm—Davis Chin

(57) ABSTRACT

There is provided a new polysilicon fuse structure for implementation within integrated circuit devices so as to permit programming of the same. The polysilicon fuse structure includes a first electrical contact region, a second electrical contact region, and multiple fuse regions interconnected between the first electrical contact region and the second electrical contact region. The multiple fuse regions are formed of a plurality of strips, each being of a different width and/or length, which are disposed in a spaced-apart relationship so as to form a small opening between adjacent strips. A number of the plurality of strips is selectively blown when a predetermined amount of current is passed from one of the first and second electrical contact regions through the plurality of strips to the other one of the first and second electrical contact regions so to limit the current passing to an integrated circuit device connected thereto during normal operating conditions.

6 Claims, 3 Drawing Sheets

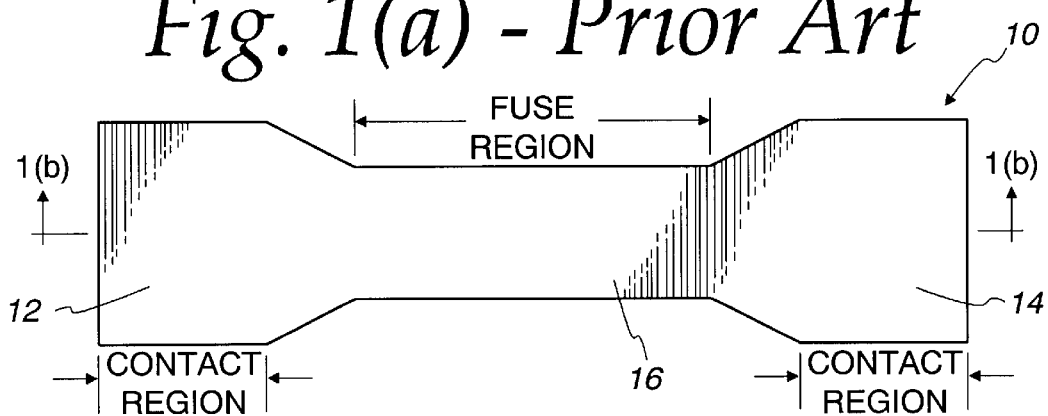
*Fig. 1(a) - Prior Art*
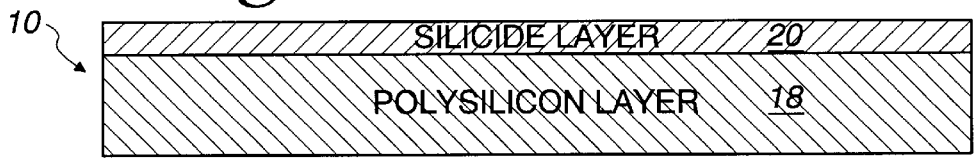
*Fig. 1(b) - Prior Art*
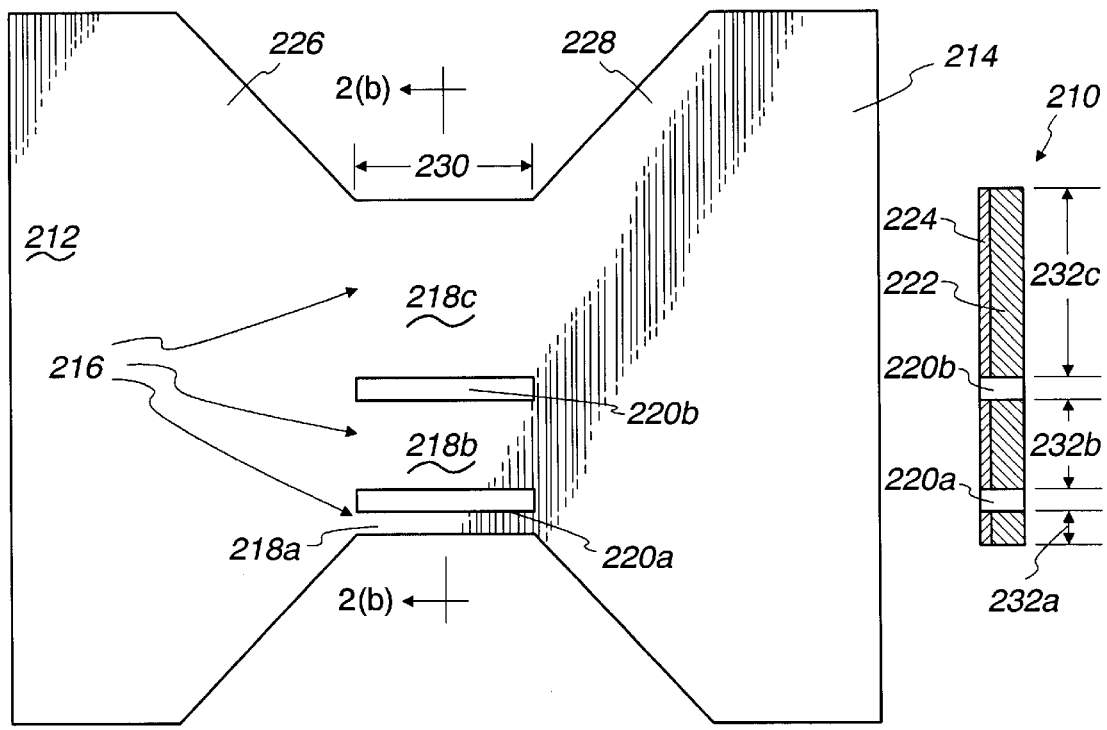
*Fig. 2(a)*   *Fig. 2(b)*

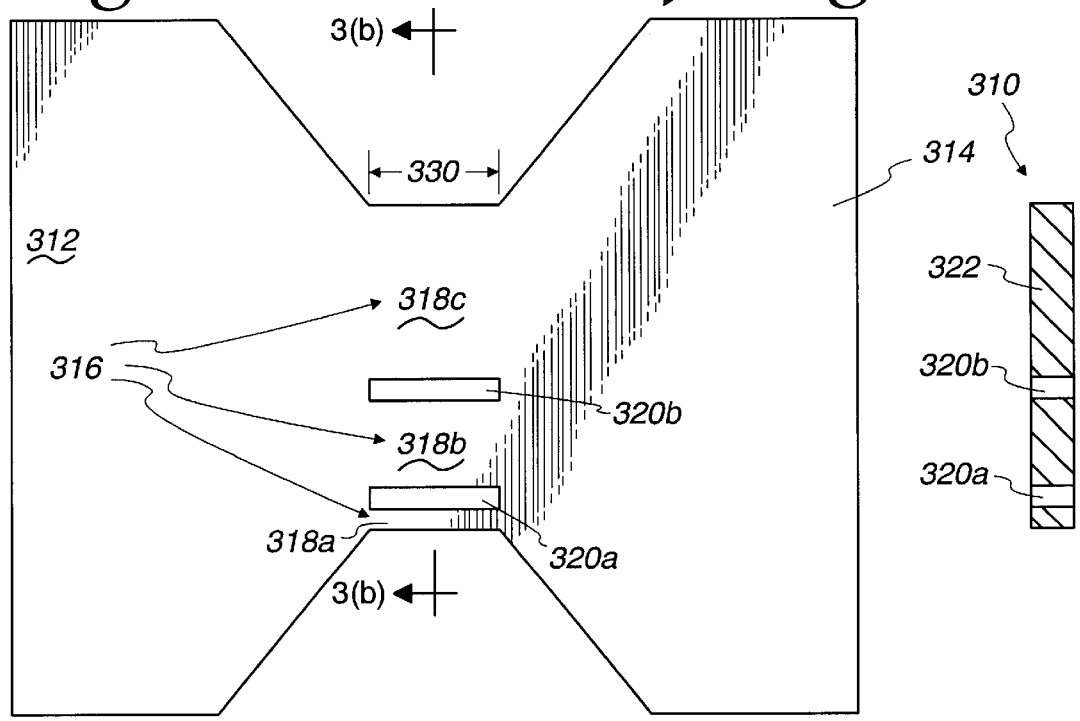
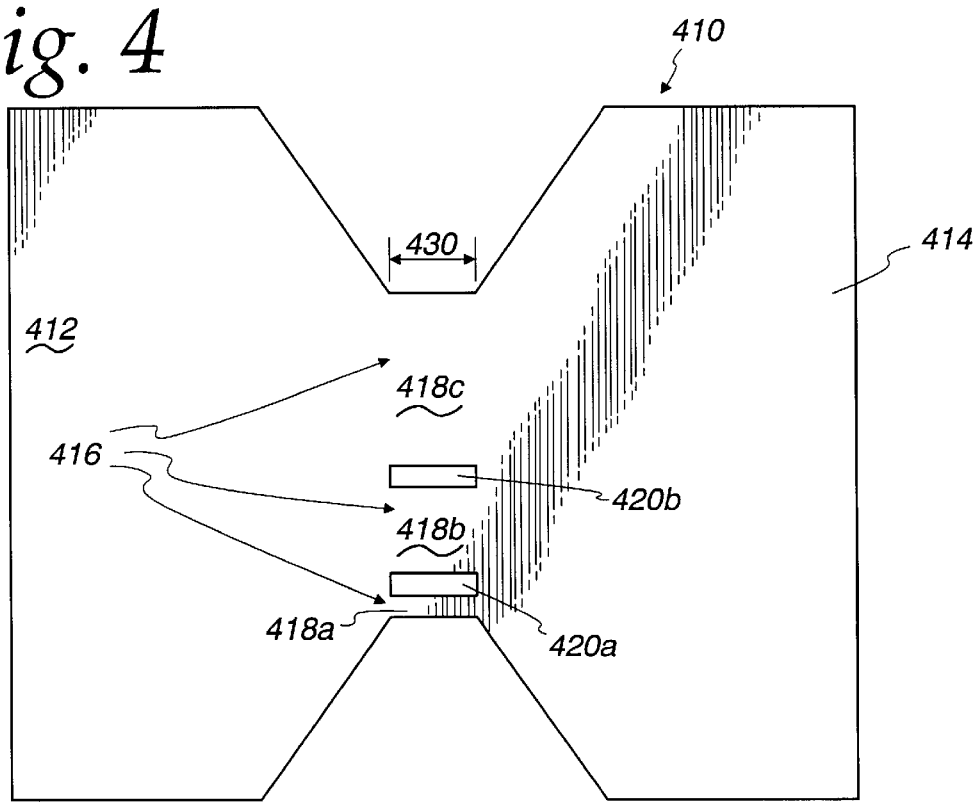

USING POLYSILICON FUSE FOR IC PROGRAMMING

BACKGROUND OF THE INVENTION

1. Field of the Invention

This invention relates generally to polysilicon fuse devices and more particularly, it relates to a polysilicon fuse structure of a new and novel construction for implementation within integrated circuit devices so as to permit programming.

2. Description of the Prior Art

In an article entitled "Comparison of Transformation to Low-Resistivity Phase and Agglomeration of $TiSi_2$ and $CoSi_2$" and authored by Jerome B. Lasky et al., IEEE Transactions on Electron Devices, Vol. 38, No. 2, February 1991, pp. 262–269, there is reported the investigation of the phase transformation and stability of titanium silicide on $n^+$ diffusions. Similar studies were performed for cobalt silicide on $n^+$ and $p^+$ diffusions.

Further, a study was performed on a new programmable element based on agglomeration of the titanium-silicide layer on top of poly fuses. This is described and illustrated in an article entitled "A PROM Element Based on Salicide Agglomeration of Poly Fuse in a CMOS Logic Process" and authored by Mohsen Alavi et al., 1997 IEEE, 1997 IEDM Technical Digest, 1997, pp. 855–858. In FIGS. 6(a)–6(d) at page 857 there are shown various fuse shapes each having a length of about 2 µm and a width in the range of 0.22 µm to 0.27 µm.

As is generally well-known, in computer systems and other related electrical equipment there are used a large number of different types of semiconductor IC memory devices, such as programmable read-only memory (PROM) programmable logic arrays (PLA), and redundancy memory arrays. Fuse arrays are typically formed during the manufacturing of these semiconductor IC memory devices. The purpose of the fuses in the PROM or PLA devices is to customize it for a specific application. In particular, the PROM or PLA device is programmed by opening or blowing the appropriate fuses in selected memory cells. In connection with the redundancy memory arrays, the fuses are used to replace defective memory cells with spare substitute cells which were fabricated in the array during the manufacturing process.

There have been provided heretofore in the prior art various types of fuse devices. The most common type fuse is a metal link formed of tungsten. In order to blow the fuse, current is driven through the metal link so as to heat up the same to its melting point and to thus cause a break in the link to occur. However, the metal link fuses are not viable for use with the IC memory devices formed using the newer process technologies having thinner gate oxides since they require large programming currents of over 100 milliamperes to blow. In addition, the metal link fuses may be caused to be inappropriately reconnected by an electromigration phenomenon which occurs during operations.

As a result, there has now been developed a polysilicon fuse which requires a lesser amount of current than the metal link fuse to open the same during programming. For a similar geometry, the current required to blow by fracturing (e.g., vaporization of the poly material) the polysilicon fuse is on the order of 50–100 milliamperes. This is referred to as a "hot blow." The polysilicon fuse may have in some cases a multi-layer construction consisting of a polysilicon layer and a silicide layer disposed on top of the polysilicon layer. This latter type of polysilicon fuse is referred to as a "silicided polysilicon fuse." The silicided polysilicon fuse is blown by a phase transformation (e.g., agglomeration at the current of 10–20 milliamperes) of the silicide layer. This is referred to as a "soft blow."

In FIG. 1(a), there is shown a top plan view of a conventional silicided polysilicon fuse device 10 which is quite similar to the one illustrated in FIG. 6(a) of the Alavi et al. article and is labeled as "Prior Art." The fuse device 10 is comprised of a first contact region 12, a second contact region 14 separated from the first contact region 12, and a fuse region 16 defined by a single narrow strip formed between the first and second contact regions. In FIG. 1(b), there is shown a cross-sectional view of the fuse device 10 taken along the line 1—1 of FIG. 1(a). As can be seen, the fuse device 10 includes a polysilicon layer 18 and a silicide layer 20 formed on the top surface of the polysilicon layer 18. The polysilicon layer 18 has a thickness of approximately 0.25 µm and a sheet resistance of about 1,000 ohms/sq. in. The silicide layer 20 may be made of a titanium silicide ($TiSi_2$) film or other like silicides. The silicide layer 20 has a thickness of approximately 0.025 µm and a sheet resistance of about 10 ohms/sq. in.

In operation, the fuse device 10 has a first resistance prior to being programmed or "blown" and has a much higher second resistance after programming or blowing. Prior to the blowing of the fuse device 10, the first resistance is determined by the resistance of the silicide layer 20. After the fuse device 10 is blown, a discontinuity will be formed in the silicide layer 20. This second resistance of the fuse device will be increased to a higher value and is dependent upon the ratio of the resistance of the polysilicon layer to the resistance of the silicide layer 20. As a programming voltage is applied across the first and second contact regions 12, 14 (FIG. 1(a)), current will flow from the first contact region 12, through the narrow strip 16, to the second contact region 14. The current flowing therethrough will cause the silicide layer 20 to heat up and the silicide itself will agglomerate to create a discontinuity. Since the silicide layer 20 has a lower resistance than the polysilicon layer 18, there will be caused an increased resistance to occur.

Nevertheless, the non-silicided polysilicon fuses or silicided polysilicon fuses of the existing designs suffer from the disadvantages that they both use a single narrow strip defining the fuse element which is blown by fracturing the polysilicon layer or phase transformation of the silicide layer so as to increase the resistance. As can thus be seen, the fuse device 10 of FIG. 1 has either an unprogrammed state where the fuse is not blown (unburned) or a programmed state where it is blown (burned). Since the unblown or unburned (unprogrammed) fuse has a lower resistance, this may be interpreted as a low or "0" logic level. On the other hand, the blown or burned (programmed) fuse has a higher resistance, this may be interpreted as a high or "1" logic level.

However, there are times where it would be desirable to selectively program the amount of current within a predetermined range that is passed through the integrated circuit device during its normal operating conditions. This is accomplished by the inventors of the present invention by the provision of a new polysilicon fuse structure having multiple fuse regions each with a different width and/or length dimension. As a result, dependent upon the amount of programming current applied, a selectable number of the multiple fuse regions will be secuentially blown so as to provide the proper resistance thereby limiting the amount of current that is passed to the integrated circuit device. This type of programming is referred to as analog programming where one of a number of different resistance values within a range can be selected.

SUMMARY OF THE INVENTION

Accordingly, it is a general object of the present invention to provide a new polysilicon fuse structure for implementation within integrated circuit devices which overcomes the disadvantages of the conventional polysilicon fuses.

It is an object of the present invention to provide a new polysilicon fuse structure for implementation within integrated circuit devices so as to permit analog programming of the same.

It is another object of the present invention to provide a new polysilicon fuse structure for implementation within integrated circuit devices which will allows for selective programming of the current that is passed through the integrated circuit devices.

It is still another object of the present invention to provide a new polysilicon fuse structure for implementation within integrated circuit devices which includes multiple fuse regions each having a different width and/or length dimension formed between first and second electrical contact regions.

In a preferred embodiment of the present invention, there is provided an improved polysilicon fuse structure for implementation within integrated circuit devices so as to permit programming of the same. The polysilicon fuse structure includes a first electrical contact region, a second electrical contact region, and multiple fuse regions. The multiple fuse regions are interconnected between the first electrical contact region and the second electrical contact region. The fuse regions are formed of a plurality of strips which are disposed in a spaced-apart relationship so as to form a small opening between adjacent strips.

Each of the plurality of strips has a different width and/or length dimension. In use, a number of the plurality of the strips is selectively blown when a current is passed from one of the first and second electrical contact regions through the plurality of strips to the other one of the first and second electrical contact regions. In this manner, there is limited the current passing to the integrated circuit devices during normal operating conditions.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein:

FIG. 1(a) is a top plan view of a conventional silicided polysilicon fuse;

FIG. 1(b) is a cross-sectional view, taken along the lines 1—1 of FIG. 1(a);

FIG. 2(a) is a top plan view of a silicided polysilicon fuse structure, constructed in accordance with the principles of the present invention;

FIG. 2(b) is a cross-sectional view, taken along the lines 2—2 of FIG. 2(a);

FIG. 3(a) is a top plan view of a second embodiment of a non-silicided polysilicon fuse of the present invention;

FIG. 3(b) is a cross-sectional view, taken along the lines 3—3 of FIG. 3(a);

FIG. 4 is a top plan view of a third embodiment of a silicided polysilicon fuse structure in accordance with the present invention;

DESCRIPTION OF THE PREFERRED EMBODIMENTS

Figure 5:
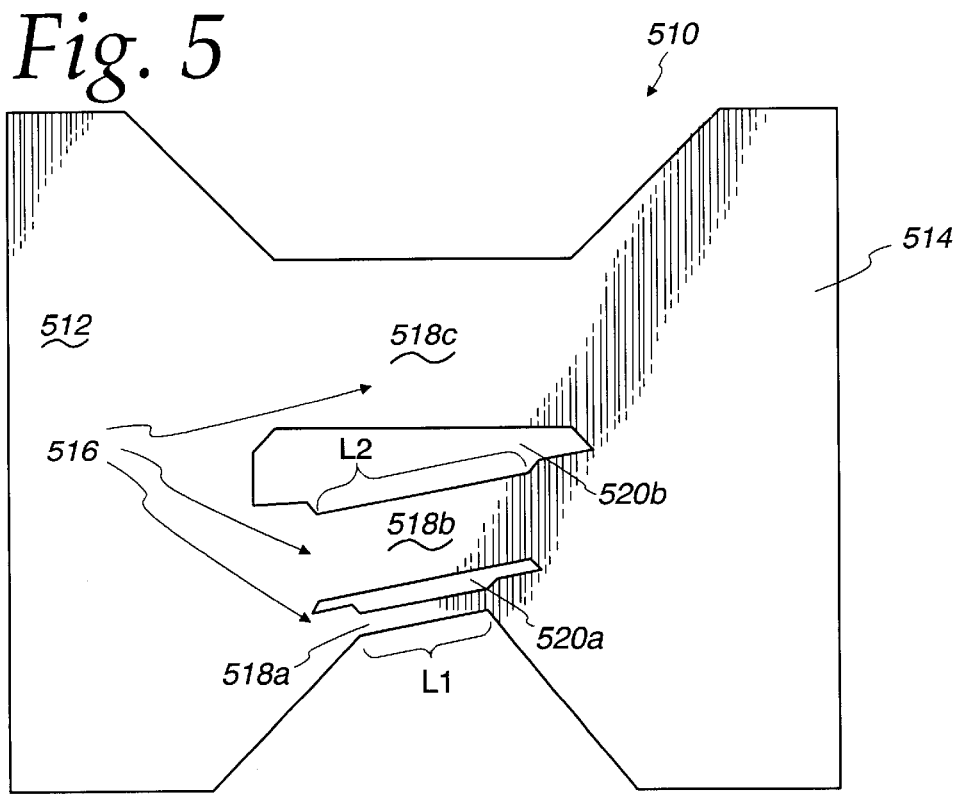
FIG. 5 is a top plan view of a fourth embodiment of a silicided polysilicon fuse structure in accordance with the present invention.

Referring now in detail to the drawings, there is shown in FIG. 2(a) a new silicided polysilicon fuse structure 210, constructed in accordance with the principles of the present invention. It should be appreciated by those skilled in the art that the fuse structure 210 is only a single element disposed on a semiconductor substrate which is formed as a part of a much larger integrated circuit device, such as a PROM or PLA. The silicided fuse structure 210 is comprised of a first electrical contact region 212, a second electrical contact region 214, and multiple fuse region 216 defined by a plurality of parallel spaced-apart strips 218a, 218b, 218c of different width dimensions and formed between the first and second electrical contact regions 212 and 214. The two parallel strips 218a and 218b are separated by a first small opening or space 220a disposed therebetween. Similarly, the two parallel strips 218b and 218c are separated by a second small opening or space 220b disposed therebetween.

In FIG. 2(b) there is illustrated a cross-sectional view of the silicided polysilicon fuse structure 210, taken along the lines 2—2 of FIG. 2(a). As will be noted, the silicided polysilicon fuse structure includes a polysilicon layer 222 and a silicide layer 224 formed on the top surface of the polysilicon layer 222. In this preferred embodiment, the polysilicon layer has a thickness of approximately 0.25 $\mu$m and a sheet resistance of about 1,000 ohms/sq. in. The silicide layer 224 is preferably made of a titanium silicide ($TiSi_2$) or cobalt silicide ($CoSi_2$) film, although other silicides may also be used. The silicide layer 224 has a thickness of approximately 0.025 $\mu$m and a sheet resistance of about 10 ohms/sq. in. It should be clearly understood that the thicknesses of both the polysilicon layer 222 and the silicide layer 224 may be varied to be thicker or thinner as desired and that the corresponding sheet resistances of these layers may be changed in other embodiments.

Referring now back to FIG. 2(a), it will be seen that the silicided polysilicon fuse structure 210 includes a pair of tapered transitional regions 226, 228 formed integrally between the opposite ends of the plurality of strips 218a, 218b, 218c and the corresponding first and second electrical contact regions 212, 214. These tapered transitional regions 226 and 228 serve to increase the current density in the narrow strips 218a, 218b, 218c during programming. While the electrical contact regions 212, 214 have been depicted as being rectangular in shape, it will be appreciated that they may be made in alternate embodiments to be round, square, or any other desired shape. Further, the transitional regions 226, 228 may be omitted entirely in other embodiments.

Unlike the prior art of FIG. 1(a) in which the fuse region 16 is formed of a single narrow strip, the multiple fuse regions 216 of the present invention in FIG. 2(a) consists of the plurality (three) parallel strips 218a 218c which are separated or divided by the small openings 220a and 220b, respectively. It should be noted that the length and width dimensions of each of the plurality of strips can be changed to accommodate fuse requirements and other considerations. In this particular embodiment, each of the plurality of strips 218a–218c has a length 230 of approximately 2.0 $\mu$m. The first strip 218a is made to be the narrowest and has a width 232a of about 0.250 µm. The second strip 218b is made to be wider than the first strip 218b has a width 232b of about 1.0 µm. The third strip 218c is made to be the widest and has a width 232c of about 2.0 µm. Each of the first and second small openings has also a length of 2.0 µm and a width of about 0.250 µm.

In operation, when a first programming voltage or potential is selected and applied across the first and second electrical contact regions 212, 214 a first predetermined amount of current will be caused to flow from one of the contact regions to the other contact region through the silicide layer 222 on each of the plurality of strips 218a–218c. As a consequence, the first predetermined amount of current will cause the silicide layer 222 on the plurality of strips to heat up and the silicide will agglomerate so that the narrowest strip (e.g., first strips 218a ) will blow first creating a discontinuity in the silicide layer 222. Thereafter, all of the current will now flow through the remaining strips that were not blown. This serves to limit the amount of current at a first level passing through the fuse structure and on to the integrated circuit device connected thereto.

When a second higher programming voltage or potential is selected and applied across the first and second electrical contact regions 212, 214 a second higher predetermined amount of current will be caused to flow from one of the contact regions to the other contact region through the silicide layer 222 on the remaining ones of the plurality of strips 218a–218c that were not blown. As a result, the next wider strip (e.g., second strip 218b ) will be blown so that all of the current will now flow through the only remaining strip 218c. This serves again to limit the amount of current at a second level passing through the fuse structure and on to the integrated circuit device connected thereto.

Finally, when a third higher programming voltage or potential (higher than the second current ) is selected and applied across the first and second electrical contact regions 212, 214 a third higher predetermined amount of current will be caused to flow from one of the contact regions to the other contact region through the silicide layer 222 on the remaining strips 218c that was not blown. As a result, the widest strip (e.g., third strip 218c will be blown. This will again limit the amount of current at a third level passing through the fuse structure and on to the integrated circuit device connected thereto.

As can be seen, by providing the plurality of varied-width strips instead of a single strip this allow for selective programming of the amount of current within a predetermined range that is passed through the integrated circuit device. Thus, by selectively blowing a desired number of the plurality of parallel strips in the present invention, there is obtained an analog programming of the integrated circuit device by controlling or limiting the amount of current that is permitted to flow therethrough.

While there is illustrated only three parallel strips of different widths in this preferred embodiment, it should be appreciated by those skilled in the art that any desired number of additional strips can be further provided so as to increase the number of discrete current levels within a given range. Alternately, the multiple fuse regions may consist of only two parallel strips of different widths. Further, in other embodiments, some of the parallel strips may be made to have equal widths.

In FIG. 3(a) there is shown a top plan view of a second embodiment of a non-silicided polysilicon fuse structure 310 of the present invention. In FIG. 3(b) there is shown a cross-sectional view of the non-silicided polysilicon fuse structure 310, taken along the lines 3—3 of FIG. 3(a). The polysilicon fuse structure 310 is comprised of a first electrical contact region 312, a second electrical contact region 314, and multiple fuse regions 316 defined by three parallel spaced-apart strips 318a, 318b, 318c and formed between the first and second electrical contact regions 312 and 314. The two strips 318a, 318b are separated by a small opening or space 320a disposed therebetween. The two strips 318b, 318c are separated by a small opening or space 320b disposed therebetween.

The polysilicon fuse structure 310 differs from the fuse structure 210 in that it is formed of only a single polysilicon layer 322 with the silicide layer in the fuse structure 210 being omitted. Further, the length dimension 330 of each of the parallel strips 318a, 318b, 318c has been shortened to 1.5 µm. Except for these structural differences, the operation of the polysilicon fuse structure 310 functions in an identical manner as the polysilicon fuse structure 210. Thus, a detailed description of this operation will not be repeated.

In FIG. 4, there is depicted a top plan view of a third embodiment of a silicided polysilicon fuse structure 410 of the present invention. The polysilicon fuse structure 410 is substantially identical in its construction to the fuse structure 210 of FIG. 2(a). The polysilicon fuse structure 410 is comprised of a first electrical contact region 412, a second electrical contact region 414, and multiple fuse regions 416 defined by three parallel spaced-apart strips 418a, 418b, 418c and formed between the first and second electrical contact regions 412 and 414. The two parallel strips 418a, 418b are separated by a small opening or space 420a disposed therebetween. The two parallel strips 418b, 418c are separated by a small opening or space 420b disposed therebetween. The length dimension 430 of each of the parallel strips 418a–418c has been shortened to 1.0 µm.

In FIG. 5, there is depicted a top plan view of a fourth embodiment of a silicided polysilicon fuse structure 510 of the present invention. The polysilicon fuse structure 510 is substantially identical in its construction to the fuse structure 410 of FIG. 4. The polysilicon fuse structure 510 is comprised of a first electrical contact region 512, a second electrical contact region 514, and multiple fuse regions 516 defined by three spaced-apart strips 518a, 518b, 518c and formed between the first and second electrical contact regions 512 and 514. The two strips 518a, 518b are separated by a small opening or space 520a disposed therebetween. The two strips 518b, 518c are separated by a small opening or space 520b disposed therebetween. The polysilicon fuse structure 510 differs from the fuse structure 410 in that at least two of the strips are disposed or oriented at an angle relative to each other. Further, the length dimension L1 of the strip 518a has been made to be different than the length dimension L2 of the strip 518b.

Figure 6:
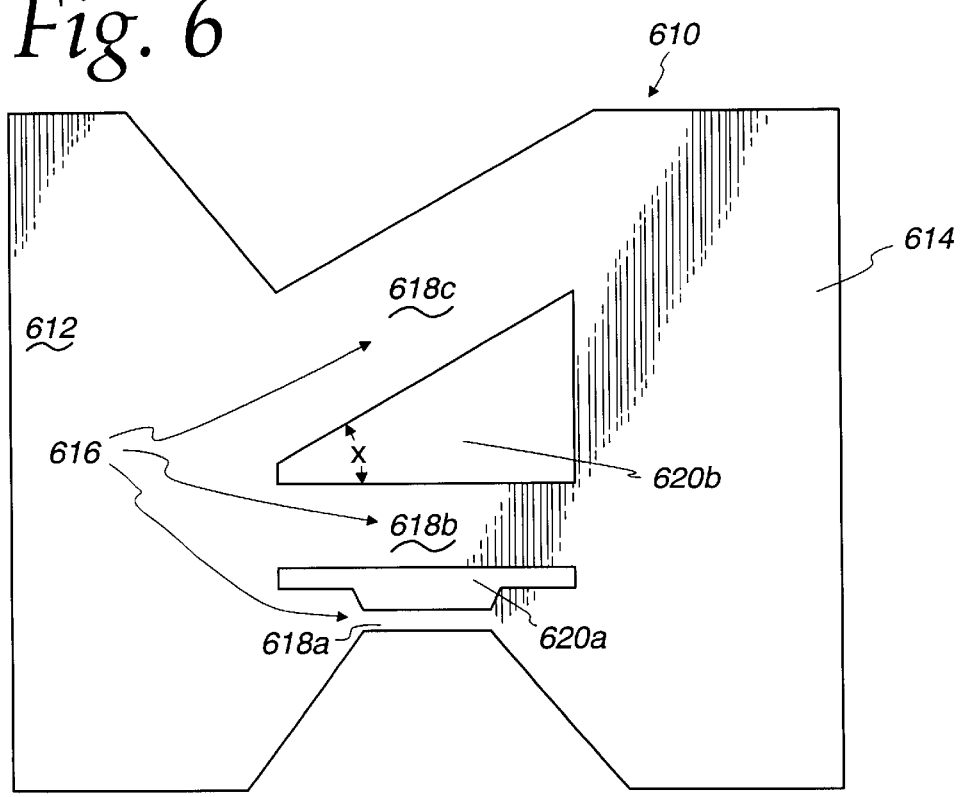
FIG. 6 is a top plan view of a fifth embodiment of a silicided polysilicon fuse structure in accordance with the present invention.

In FIG. 6, there is depicted a top plan view of a fifth embodiment of a silicided polysilicon fuse structure 610 of the present invention. The polysilicon fuse structure 610 is substantially identical in its construction to the fuse structure 510 of FIG. 5. The polysilicon fuse structure 610 is comprised of a first electrical contact region 612, a second electrical contact region 614, and multiple fuse regions 616 defined by three spaced-apart strips 618a, 618b, 618c and formed between the first and second electrical contact regions 612 and 614. The two strips 618a, 618b are separated by a small opening or space 620a disposed therebetween. The two strips 618b, 618c are separated by a small opening or space 620b disposed therebetween. The polysilicon fuse 610 differs from the fuse structure 510 in that only the strip 618c is disposed or oriented angularly while the strips 618a and 618b are maintained in the horizontal positions. Further, the strips 618c and 618b are disposed at an angle X relative to each other.

In alternative embodiments, the silicide layer 224 of the silicided polysilicon fuse structure 210 of FIG. 2(b) may be replaced by a suitable metal layer, such as made of tungsten. It has been observed that the phase and electrical properties of the metal layer/polysilicon layer fuse structure can be changed by annealing. Further, the polysilicon layer 322 of the non-silicided polysilicon fuse structure 310 of FIG. 3(b) may be replaced with a doped polysilicon layer having either an n-type or p-type material formed therein in other embodiments.

From the foregoing detailed description, it can thus be seen that the present invention provides an improved polysilicon fuse structure for implementation within integrated circuit devices so as to permit programming of the same. This is achieved by the provision of multiple fuse regions defined by a plurality of spaced-apart strips each of a different width and/or length interconnected between first and second electrical contact regions. As a result, a selected number of the plurality of strips can be blown so as to program the integrated circuit device connected thereto.

While there has been illustrated and described what are at present considered to be preferred embodiments of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiments disclosed as the best modes contemplated for carrying out the invention, but that the invention will include all embodiments falling within the scope of the appended claims.

What is claimed is:

1. A polysilicon fuse structure for implementation within integrated circuit devices so as to permit programming comprising:

a first electrical contact region;

a second electrical contact region;

multiple fuse regions interconnected between said first electrical contact region and said second electrical contact region;

said multiple fuse regions being formed of a plurality of strips which are disposed in a spaced-apart relationship so as to form a small opening between adjacent strips;

each of said plurality of strips having a different width and/or length;

at least two strips of said plurality of strips being disposed at an acute angle relative to each other;

a number of said plurality of strips being selectively blown when a predetermined amount current is passed from one of said first and second electrical contact regions through said plurality of strips to said other one of said first and second electrical contact regions so as to limit the current passing to an integrated circuit device connected thereto during normal operating conditions and said polysilicon fuse structure including a polysilicon layer and a suicide layer formed on the top surface of said polysilicon layer.

2. A polysilicon fuse structure as claimed in claim 1, wherein each of said plurality of strips has a width dimension in the range of 0.25 to 2.0 $\mu$m and has a length dimension in the range of 1.0 to 2.0 $\mu$m.

3. A polysilicon fuse structure as claimed in claim 2, wherein said silicide layer consists of a titanium silicide film.

4. A polysilicon fuse structure as claimed in claim 1, wherein said silicide layer consists of a cobalt silicide film.

5. A polysilicon fuse structure as claimed in claim 2, wherein said plurality of strips is comprised of three parallel strips.

6. A polysilicon fuse structure as claimed in claim 1, wherein said polysilicon layer has a thickness of 0.25 $\mu$m and a sheet resistance of about 1,000 ohms/sq. in. and wherein said silicide layer has a thickness of approximately 0.025 $\mu$m and a sheet resistance of about 10 ohms/sq. in.

* * * * *

UNITED STATES PATENT AND TRADEMARK OFFICE
CERTIFICATE OF CORRECTION

PATENT NO. : 6,242,790 B1
DATED : June 5, 2001
INVENTOR(S) : Ting Y. Tsui et al.

Page 1 of 1

It is certified that error appears in the above-identified patent and that said Letters Patent is hereby corrected as shown below:

<u>Column 2,</u>
Line 64, change "secuentially" to -- sequentially --.

Signed and Sealed this

Twenty-fifth Day of December, 2001

Attest:

JAMES E. ROGAN
*Attesting Officer*     *Director of the United States Patent and Trademark Office*